United States Patent
Tian

(10) Patent No.: US 10,536,157 B2
(45) Date of Patent: Jan. 14, 2020

(54) APPARATUS, SYSTEM AND METHOD FOR ANALOG-TO-DIGITAL CONVERSION

(71) Applicant: ZHENGZHOU YUNHAI INFORMATION TECHNOLOGY CO., LTD., Zhengzhou, Henan (CN)

(72) Inventor: Wenlu Tian, Henan (CN)

(73) Assignee: ZHENGZHOU YUNHAI INFORMATION TECHNOLOGY CO., LTD., Zhengzhou, Henan (CN)

( * ) Notice: Subject to any disclaimer, the term of this patent is extended or adjusted under 35 U.S.C. 154(b) by 0 days.

(21) Appl. No.: 16/096,644

(22) PCT Filed: Jul. 21, 2017

(86) PCT No.: PCT/CN2017/093868
§ 371 (c)(1),
(2) Date: Oct. 25, 2018

(87) PCT Pub. No.: WO2018/120795
PCT Pub. Date: Jul. 5, 2018

(65) Prior Publication Data
US 2019/0158104 A1    May 23, 2019

(30) Foreign Application Priority Data
Dec. 29, 2016 (CN) .......................... 2016 1 1247175

(51) Int. Cl.
*H03M 1/12* (2006.01)
*H03M 1/06* (2006.01)

(52) U.S. Cl.
CPC ......... *H03M 1/124* (2013.01); *H03M 1/0619* (2013.01); *H03M 1/1205* (2013.01); *H03M 2201/622* (2013.01)

(58) Field of Classification Search
CPC .. H03M 1/124; H03M 1/1069; H03M 1/1205; H03M 1/0621
(Continued)

(56) References Cited

U.S. PATENT DOCUMENTS 9,101,767 B2 *   8/2015 Trier ................... A61N 1/36071
2008/0151823 A1 *   6/2008 Quigley .............. H04L 12/2801
                                                            370/329
(Continued)

FOREIGN PATENT DOCUMENTS

CN    201464525 U    5/2010
CN    203104399 U    7/2013
(Continued)

OTHER PUBLICATIONS

International Search Report for PCT/CN2017/093868 dated Oct. 19, 2017, ISA/CN.

*Primary Examiner* — Peguy Jean Pierre
(74) *Attorney, Agent, or Firm* — Yue (Robert) Xu; Apex Attorneys at Law, LLP

(57) ABSTRACT

A signal processing apparatus, a signal processing system and a signal processing method are provided. The signal processing apparatus includes at least one analog channel and an analog-to-digital conversion unit. Each of the at least one analog channel is configured to, in response to receiving a first analog signal inputted from outside, condition the first analog signal to generate a second analog signal, and send the second analog signal to the analog-to-digital conversion unit. The analog-to-digital conversion unit is configured to convert the second analog signal sent from any of the at least one analog channel into a digital signal.

15 Claims, 3 Drawing Sheets

(58) Field of Classification Search
USPC .............................. 341/155; 713/323; 455/15
See application file for complete search history.

(56) References Cited

U.S. PATENT DOCUMENTS

2016/0256068 A1* 9/2016 Harrison ............ A61B 5/04014
2016/0352300 A1   12/2016 Nozokido

FOREIGN PATENT DOCUMENTS

| CN | 103792413 A | 5/2014 |
| CN | 104991142 A | 10/2015 |
| CN | 106656178 A | 5/2017 |

\* cited by examiner

APPARATUS, SYSTEM AND METHOD FOR ANALOG-TO-DIGITAL CONVERSION

The present application is the national phase of International Patent Application No. PCT/CN2017/093868 filed on Jul. 21, 2017, which claims priority to Chinese Patent Application No. 201611247175.8, titled "SIGNAL PROCESSING APPARATUS, SYSTEM AND METHOD", filed on Dec. 29, 2016 with the Chinese Patent Office, both of which are incorporated herein by reference in their entireties.

FIELD

The present disclosure relates to the technical field of computer, and in particular, to a signal processing apparatus, a signal processing system, and a signal processing method.

BACKGROUND

With rapid development of digital electronic technology, it is widely used in various fields. Compared with analog electronic technology, digital signals are highly reliable, and easy to be analyzed, processed, and stored by a computer.

At present, an A/D (analog to digital) converter can be used to directly convert an acquired analog signal into a digital signal for output.

However, the collected analog signals have a wide range. For example, an edge analog signal may be acquired. Thereby, analog signal processing has low accuracy in the conventional technology.

Technical Problem

A signal processing apparatus, a signal processing system and a signal processing method are provided according to the present disclosure, to improve accuracy of processing an analog signal.

Solution to Problem

Technical Solution

In order to achieve the above object, following technical solutions are provided according to the present disclosure.

In a first aspect, a signal processing apparatus is provided according to the present disclosure, including: at least one analog channel, and an analog-to-digital conversion unit.

Each of the at least one analog channel is configured to, in response to receiving a first analog signal inputted from outside, condition the first analog signal to generate a second analog signal, and send the second analog signal to the analog-to-digital conversion unit.

The analog-to-digital conversion unit is configured to convert the second analog signal sent from any of the at least one analog channel into a digital signal.

Further, the first analog signal is a voltage signal of a tested circuit.

Each of the at least one analog channel includes an interface protector, an attenuator, an amplifier, and a filter.

The interface protector is configured to determine, in response to receiving the voltage signal of the tested circuit inputted from outside, whether the voltage signal is in a preset voltage range; compare, in response to the voltage signal being in the preset voltage range, the voltage signal with a preset first threshold and a preset second threshold; send, in response to the voltage signal being less than the first threshold, the voltage signal to the amplifier; send, in response to the voltage signal being greater than the second threshold, the voltage signal to the attenuator; and send, in response to the voltage signal being not less than the first threshold and not greater than the second threshold, the voltage signal to the filter.

The amplifier is configured to perform amplitude amplification on the voltage signal sent by the interface protector, and send the amplified voltage signal to the filter.

The attenuator is configured to perform amplitude attenuation on the voltage signal sent by the interface protector, and send the attenuated voltage signal to the filter.

The filter is configured to perform high frequency noise signal filtering on the received voltage signal, and send the filtered voltage signal to the analog-to-digital conversion unit.

Further, the analog-to-digital conversion unit includes a multiplexer and an analog-to-digital converter, where the multiplexer includes eight input channels, an output channel, and three address codes.

Based on setting information of an external FPGA (Field Programmable Gate Array), the three address codes correspond to eight control signals, and the eight control signals correspond to the eight input channels in a one-to-one manner.

Each of the at least one analog channels corresponds to one of the eight input channels.

Each of the at least one analog channels is configured to send the generated second analog signal to the corresponding one of the eight input channel.

The output channel is configured to sequentially collect the second analog signals of the eight input channels at predetermined time intervals uniquely corresponding to the eight input channels, and send the second analog signals to the analog-to-digital converter.

The analog-to-digital converter is configured to convert the second analog signal sent by the output channel into the digital signal.

Further, the signal processing apparatus further includes a self-correcting unit.

The self-correcting unit is configured to predetermine a correction analog signal and a correction digital signal corresponding to the correction analog signal. For each of the at least one analog channel as a target analog channel, the self-correcting unit is configured to output the correction analog signal to the target analog channel, acquire a current digital signal corresponding to the correction analog signal and outputted by the analog-to-digital conversion unit, and determine a difference between the correction digital signal and the current digital signal as a compensation value for the target analog channel.

The analog-to-digital conversion unit is further configured to perform, after converting the second analog signal sent by the target analog channel into the digital signal, compensation on the digital signal based on the compensation value of the target analog channel.

Further, the signal processing apparatus further includes a physical address configuration unit.

The physical address configuration unit includes an 8-bit dual in-line package (DIP) switch, and each bit of the DIP switch has a break pin that is connected to a pull-up resistor applied with a fixed voltage, and has a close pin that is grounded.

The physical address configuration unit is configured to control a switch state of each bit of the DIP switch based on the setting information of the external FPGA, and configure a MAC (Media Access Control/Medium Access Control)

address of the signal processing apparatus based on the switch state of each bit of the DIP switch.

In a second aspect, a signal processing system is provided according to the present disclosure, including: any one of the aforementioned signal processing apparatus, and a processor.

Each of the signal processing apparatus has a MAC address different form others.

The processor is connected to each of the signal processing apparatus via a CAN (Controller Area Network) bus.

In a third aspect, a signal processing method is provided according to the present disclosure, including: conditioning, for each of at least one analog channel as a target analog channel and in response to the target analog channel receiving a first analog signal inputted from outside, a first analog signal to generate a second analog signal; and converting the second analog signal into a digital signal.

Further, the first analog signal is a voltage signal of a tested circuit, conditioning the first analog signal to generate a second analog signal includes: determining whether the voltage signal is in a preset voltage range; comparing, in response to the voltage signal being in a preset voltage range, the voltage signal with a preset first threshold and a second threshold; in response to the voltage signal being less than the first threshold, performing amplitude amplification on the voltage signal to acquire the amplified voltage signal, and performing high frequency noise signal filtering on the amplified voltage signal to acquire the filtered voltage signal; in response to the voltage signal being greater than the second threshold, performing amplitude attenuation on the voltage signal to acquire the attenuated voltage signal, and performing high frequency noise signal filtering on the attenuated voltage signal to acquire the filtered voltage signal; and in response to the voltage signal being not less than the first threshold and not greater than the second threshold, performing high frequency noise signal filtering on the voltage signal to acquire the filtered voltage signal.

Further, each of the at least one analog channel corresponds to one of predetermined eight input channels, and converting the second analog signal into the digital signal includes: sending the second analog signal to an input channel corresponding to the target analog channel; collecting sequentially, by a unique output channel, the second analog signals of the eight input channels at predetermined time intervals uniquely corresponding to the eight input channels; and converting the second analog signal sent from the output channel into the digital signal.

Further, before converting the second analog signal into the digital signal, the method further includes: predetermining a correction analog signal and a correction digital signal corresponding to the correction analog signal; and for each of the target analog channel, outputting the correction analog signal to the target analog channel, acquiring a current digital signal corresponding to the correction analog signal, and determining a difference between the correction digital signal and the current digital signal as a compensation value of the target analog channel.

After converting the second analog signal into the digital signal, the method further includes: performing compensation on the digital signal using the compensation value of the target analog channel.

Beneficial Effect of Solution

Beneficial Effect

The signal processing apparatus, the signal processing system and the signal processing method are provided according to the present disclosure. The signal processing apparatus includes the at least one analog channel and the analog-to-digital conversion unit. Each of the at least one analog channel is configured to, in response to receiving the first analog signal inputted from outside, condition the first analog signal to generate the second analog signal, and send the second analog signal to the analog-to-digital conversion unit. The analog-to-digital conversion unit is configured to convert the second analog signal sent from any of the at least one analog channel into the digital signal. By conditioning the analog signal inputted from outside, the conditioned analog signal is easy to be processed by the analog-to-digital conversion unit. Therefore, with the embodiments of the present disclosure, accuracy of processing the analog signal can be improved.

BRIEF DESCRIPTION OF THE DRAWINGS

Drawing Description

For clearer illustration of the technical solutions according to embodiments of the present disclosure or conventional techniques, hereinafter are briefly described the drawings to be used in embodiments of the present disclosure or conventional techniques. Apparently, the drawings in the following descriptions are only some embodiments of the present disclosure, and other drawings may be obtained by those skilled in the art based on the provided drawings without creative efforts.

DETAILED DESCRIPTION

Embodiments

To make the object, technical solutions and advantages of the present disclosure clearer, the technical solutions according to the embodiments of the present disclosure will be described clearly and completely as follows in conjunction with the drawings in the embodiments of the present disclosure. It is apparent that the described embodiments are only a part of the embodiments according to the present disclosure, rather than all the embodiments. Any other embodiments obtained by those skilled in the art based on the embodiments in the present disclosure without any creative efforts fall in the protection scope of the present disclosure.

Figure 1:
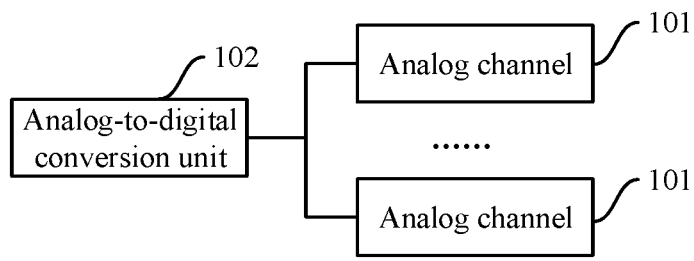
FIG. 1 is a schematic diagram of an signal processing apparatus according to an embodiment of the present disclosure.

As shown in FIG. 1, a signal processing apparatus is provided according to an embodiment of the present disclosure.

The apparatus includes at least one analog channel 101, and an analog-to-digital conversion unit 102.

Each of the analog channel 101 is configured to, in response to receiving a first analog signal inputted from outside, condition the first analog signal to generate a second analog signal, and send the second analog signal to the analog-to-digital conversion unit 102.

The analog-to-digital conversion unit 102 is configured to convert the second analog signal sent from any of the analog channel 101 into a digital signal.

The signal processing apparatus provided according to the embodiment of the present disclosure includes the at least one analog channel and the analog-to-digital conversion unit. Each of the analog channel is configured to, in response to receiving the first analog signal inputted from outside, condition the first analog signal to generate the second analog signal, and send the second analog signal to the analog-to-digital conversion unit. The analog-to-digital conversion unit is configured to convert the second analog signal sent from any of the analog channel into the digital signal. By conditioning the analog signal inputted from outside, the conditioned analog signal is easy to be processed by the analog-to-digital conversion unit. Therefore, with the embodiment in the present disclosure, accuracy of processing the analog signal can be improved.

Figure 2:
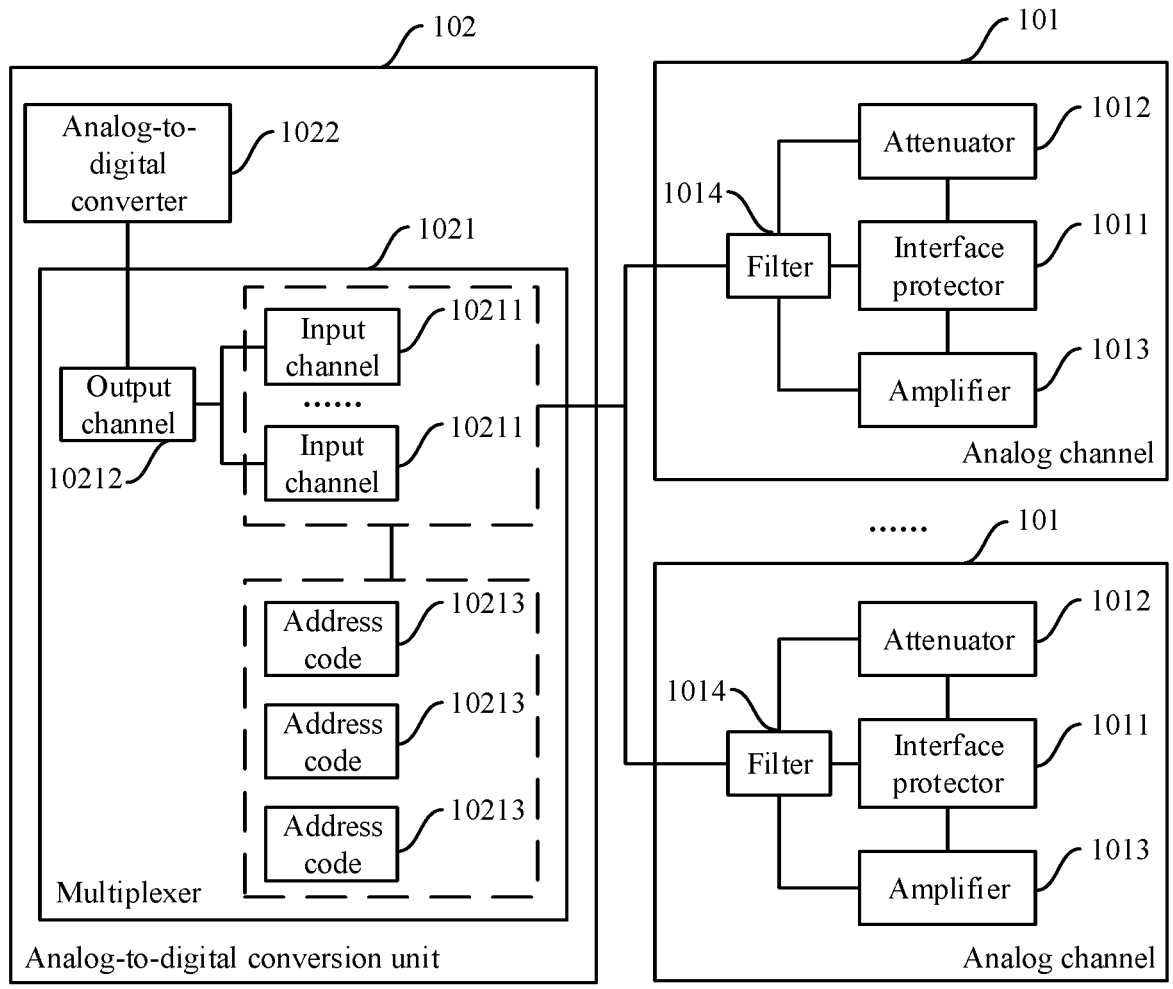
FIG. 2 is a schematic diagram of another signal processing apparatus according to an embodiment of the present disclosure.

In an embodiment of the present disclosure, referring to FIG. 2, the first analog signal is a voltage signal of a tested circuit.

Each of the analog channels 101 includes an interface protector 1011, an attenuator 1012, an amplifier 1013, and a filter 1014.

The interface protector 1011 is configured to: determine, in response to receiving the voltage signal of the tested circuit inputted from outside, whether the voltage signal is in a preset voltage range; compare, in response to the voltage signal being in the preset voltage range, the voltage signal with a preset first threshold and a preset second threshold; send, in response to the voltage signal being less than the first threshold, the voltage signal to the amplifier 1013; send, in response to the voltage signal being greater than the second threshold, the voltage signal to the attenuator 1012; and send, in response to the voltage signal being not less than the first threshold and not greater than the second threshold, the voltage signal to the filter 1014.

The amplifier 1013 is configured to perform amplitude amplification on the voltage signal sent by the interface protector 1011, and send the amplified voltage signal to the filter 1014.

The attenuator 1012 is configured to perform amplitude attenuation on the voltage signal sent by the interface protector 1011, and send the attenuated voltage signal to the filter 1014.

The filter 1014 is configured to perform high frequency noise signal filtering on the received voltage signal, and send the filtered voltage signal to the analog-to-digital conversion unit 102.

Generally, the voltage signal of the tested circuit has a wide voltage range, and a voltage signal which can be processed by the analog-to-digital conversion unit has a relatively narrow voltage range. In such case, in order to process the voltage signal inputted from outside accurately, the voltage signals inputted from outside may be conditioned differently.

Based on the preset voltage range, the voltage signal inputted from outside is conditioned only if the voltage range is in the voltage range, so as to filter out an invalid abnormal signal first. In such case, the interface protector can condition a voltage of a signal under test into a range acceptable to the analog-to-digital conversion unit.

By default, the first threshold is not greater than the second threshold according to the embodiment of the present disclosure. Based on the comparison between the voltage signal and the two thresholds in terms of magnitude, it can be determined how the voltage signal is required to be conditioned.

Different results of magnitude comparison correspond to different conditioning methods. As described above, the conditioning method may include performing amplitude amplification on the voltage signal and then filtering, performing amplitude attenuation on the voltage signal and then filtering, or directly performing filtering.

In an embodiment of the present disclosure, referring to FIG. 2, the analog-to-digital conversion unit 102 includes a multiplexer 1021 and an analog-to-digital converter 1022. The multiplexer 1021 includes eight input channels 10211, an output channel 10212 and three address codes 10213.

Based on setting information of an external FPGA, the three address codes 10213 correspond to eight control signals, and the eight control signals correspond to the eight input channels 10211 in a one-to-one manner.

Each of the analog channels 101 corresponds to one of the input channels 10211.

Each of the analog channels 101 is configured to send the generated second analog signal to the corresponding input channel.

The output channel 10212 is configured to sequentially collect the second analog signals of the input channels 10211 at predetermined time intervals uniquely corresponding to the input channels 10211, and send the second analog signals to the analog-to-digital converter 1022.

The analog-to-digital converter 1022 is configured to convert the second analog signal sent by the output channel 10212 into the digital signal.

In the embodiment of the present disclosure, considering factors of performance, cost and application environment comprehensively, it may be designed to use eight input channels to collect signals, and signal collection of the input channels may be based on time division multiplexing technology. By using a unique output channel and increasing the number of the input channels, limited collection resources can be reasonably allocated.

Based on the setting information of the external FPGA, the eight control signals corresponding to the three address codes may be 000, 001, 010, 100, 011, 110, 101 and 111. In this way, different input channels may correspond to different control signals.

The number of the analog channels may be or may not be equal to the number of the input channels, but each analog channel corresponds to an input channel.

The second analog signals in different input channels may be collected by the unique output channel at different time intervals. In the circuit, the signal of only one channel is acquired each time. In this way, the analog-to-digital converter may collect multiple channels of signals by collecting the second analog signals of different channels alternately in time.

The analog-to-digital converter and the multiplexer may be controlled by the FPGA.

Figure 3:
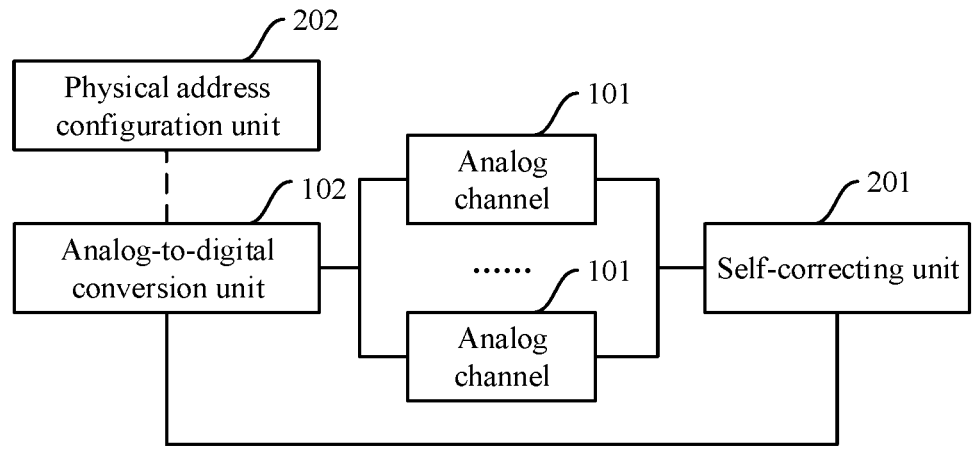
FIG. 3 is a schematic diagram of yet another signal processing apparatus according to an embodiment of the present disclosure.

In an embodiment of the present disclosure, referring to FIG. 3, the signal processing apparatus may further include a self-correcting unit 201.

The self-correcting unit 201 is configured to predetermine a correction analog signal and a correction digital signal corresponding to the correction analog signal. For each of the at least one analog channel 101 as a target analog channel, the self-correcting unit 201 is configured to output the correction analog signal to the target analog channel, acquire a current digital signal corresponding to the correction analog signal and outputted by the analog-to-digital conversion unit 102, and determine a difference between the correction digital signal and the current digital signal as a compensation value for the target analog channel.

The analog-to-digital conversion unit 102 is further configured to perform, after converting the second analog signal sent by the target analog channel into the digital signal, compensation on the digital signal based on the compensation value of the target analog channel.

From the above description, it can be seen that the analog signal inputted from outside may be conditioned by the analog channels. In the embodiment of the present disclosure, on the basis of the above, the compensation value of each analog channel may be calculated based on a predetermined self-correction solution, to further improve accuracy of signal conditioning. Thereby, after any analog signal is conditioned by the analog channel and converted into the digital signal by the analog-to-digital conversion unit, the acquired digital signal can be compensated based on the compensation value of the analog channel.

Regarding the determined correction analog signal and the corresponding correction digital signal, the correction analog signal may serve as an external input signal and be inputted into to each analog channel. Thereby, a digital signal corresponding to the correction analog signal is acquired by signal conditioning processing and analog-to-digital conversion processing. Generally, the acquired digital signal is the same as the predetermined correction digital signal. In case of a difference between the two signals, the compensation value of each analog channel may be calculated based on the difference between the two signals.

In another implement, multiple different correction analog signals and different correction digital signals corresponding to the correction analog signals may be predetermined. Based on the same self-correction principle, multiple compensation values are calculated for each analog channel. In this case, an average of the multiple compensation values may serve as the compensation value of the analog channel.

In an embodiment of the present disclosure, referring to FIG. 3, the signal processing apparatus may further include a physical address configuration unit 202.

The physical address configuration unit 202 includes an 8-bit DIP switch. Each bit of the DIP switch has a break pin that is connected to a pull-up resistor applied with a fixed voltage, and has a close pin that is grounded.

The physical address configuration unit 202 is configured to control a switch state of each bit of the DIP switch based on the setting information of the external FPGA, and configure a MAC address of the signal processing apparatus based on the switch state of each bit of the DIP switch.

For each bit of the DIP switch, in a case that the bit of the DIP switch is in a closed state, the break pin of the bit of the DIP switch is pulled to the ground. A voltage of a physical address configuration I/O terminal corresponding to the bit of the DIP switch is approximately 0V, and the physical address is configured as "0" in such case. Correspondingly, in a case that the bit of DIP switch is at an opened state, the break pin of the bit of the DIP switch is approximately the aforementioned fixed voltage value. Therefore, the voltage of a physical address configuration I/O terminal corresponding to the bit of the DIP switch is approximate the aforementioned fixed voltage value, and the physical address is configured as "1" in such case.

Thus, based on the switch state of each bit of the DIP switch, the physical address can be determined. The determined physical address may be the MAC address of the signal processing apparatus.

The external FPGA may be connected to each physical address configuration I/O terminal. Thereby, the switch state of each DIP switch may be determined under control of the external FPGA, so as to determine the MAC address of the signal processing apparatus.

The MAC addresses of different signal processing apparatuses are generally different. In a case that there are multiple signal processing apparatuses, the digital signals from the signal processing apparatuses can be distinguished based on the MAC address of each signal processing apparatus.

Figure 4:
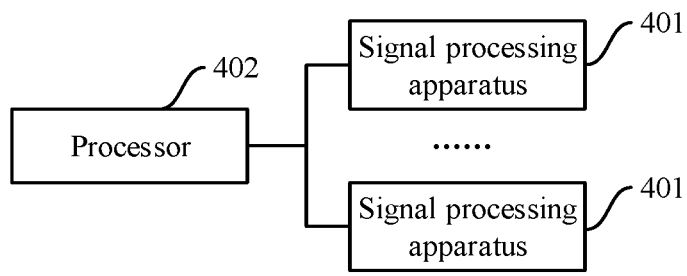
FIG. 4 is a schematic diagram of a signal processing system according to an embodiment of the present disclosure.

As shown in FIG. 4, a signal processing system is provided according to an embodiment of the present disclosure, including any of the aforementioned signal processing apparatuses 401, and a processor 402.

MAC addresses of different signal processing apparatuses 401 are different.

The processor 402 is connected to each of the signal processing apparatus via a CAN bus.

Since different signal processing apparatuses have different MAC addresses, the signal processing apparatuses with same hardware may be effectively distinguished in the signal processing system.

By connecting the processor to each of the signal processing apparatuses, digital signals from each signal processing apparatus may be acquired by the processor, to be correspondingly processed.

Figure 5:
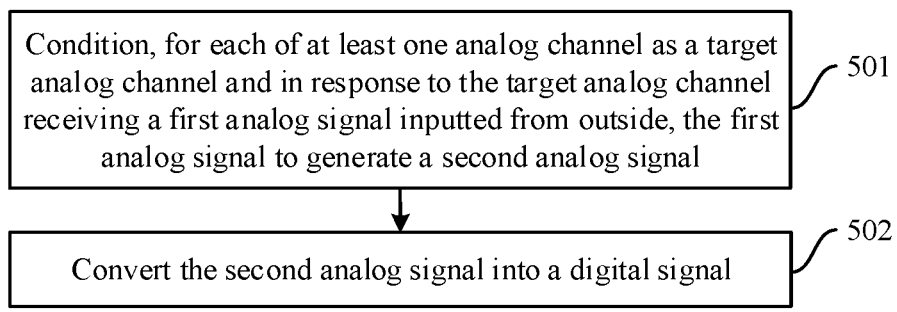
FIG. 5 is a flowchart of a signal processing method according to an embodiment of the present disclosure.

As shown in FIG. 5, a signal processing method is provided according to an embodiment of the present disclosure, including the following steps S501 and S502.

In step 501, for each of at least one analog channel as a target analog channel, a first analog signal is conditioned, in response to the target analog channel receiving the first analog signal inputted from outside, to generate a second analog signal.

In step 502, the second analog signal is converted into a digital signal.

In an embodiment of the present disclosure, the first analog signal is a voltage signal of a tested circuit.

The first analog signal is conditioned to generate the second analog signal by the following steps. It is determined whether the voltage signal is in a preset voltage range. In response to the voltage signal being in a preset voltage range, the voltage signal is compared with a preset first threshold and a second threshold. In response to the voltage signal being less than the first threshold, amplitude amplification is performed on the voltage signal to acquire the amplified voltage signal, and high frequency noise signal filtering is performed on the amplified voltage signal to acquire the filtered voltage signal. In response to the voltage signal being greater than the second threshold, amplitude attenuation is performed on the voltage signal to acquire the attenuated voltage signal, and high frequency noise signal filtering is performed on the attenuated voltage signal to acquire the filtered voltage signal. In response to the voltage signal being not less than the first threshold and not greater than the second threshold, high frequency noise signal filtering is performed on the voltage signal to acquire the filtered voltage signal.

In an embodiment of the present disclosure, each analog channel corresponds to one of the eight predetermined input channels.

The second analog signal is converted into a digital signal by the following steps. The second analog signal is sent to an input channel corresponding to the target analog channel. The second analog signals of the input channels are sequentially collected by a unique output channel at time intervals uniquely corresponding to the input channels. The second analog signal sent from the output channel is converted into the digital signal.

In an embodiment of the present disclosure, before the second analog signal is converted into a digital signal, a correction analog signal and a correction digital signal corresponding to the correction analog signal are predetermined. For each target analog channel, the correction analog signal is outputted to the target analog channel to acquire a current digital signal corresponding to the correction analog signal, and a difference between the correction digital signal and the current digital signal is determined as a compensation value of the target analog channel.

After the second analog signal is converted into a digital signal, compensation is performed on the digital signal using the compensation value of the target analog channel.

Figure 6:
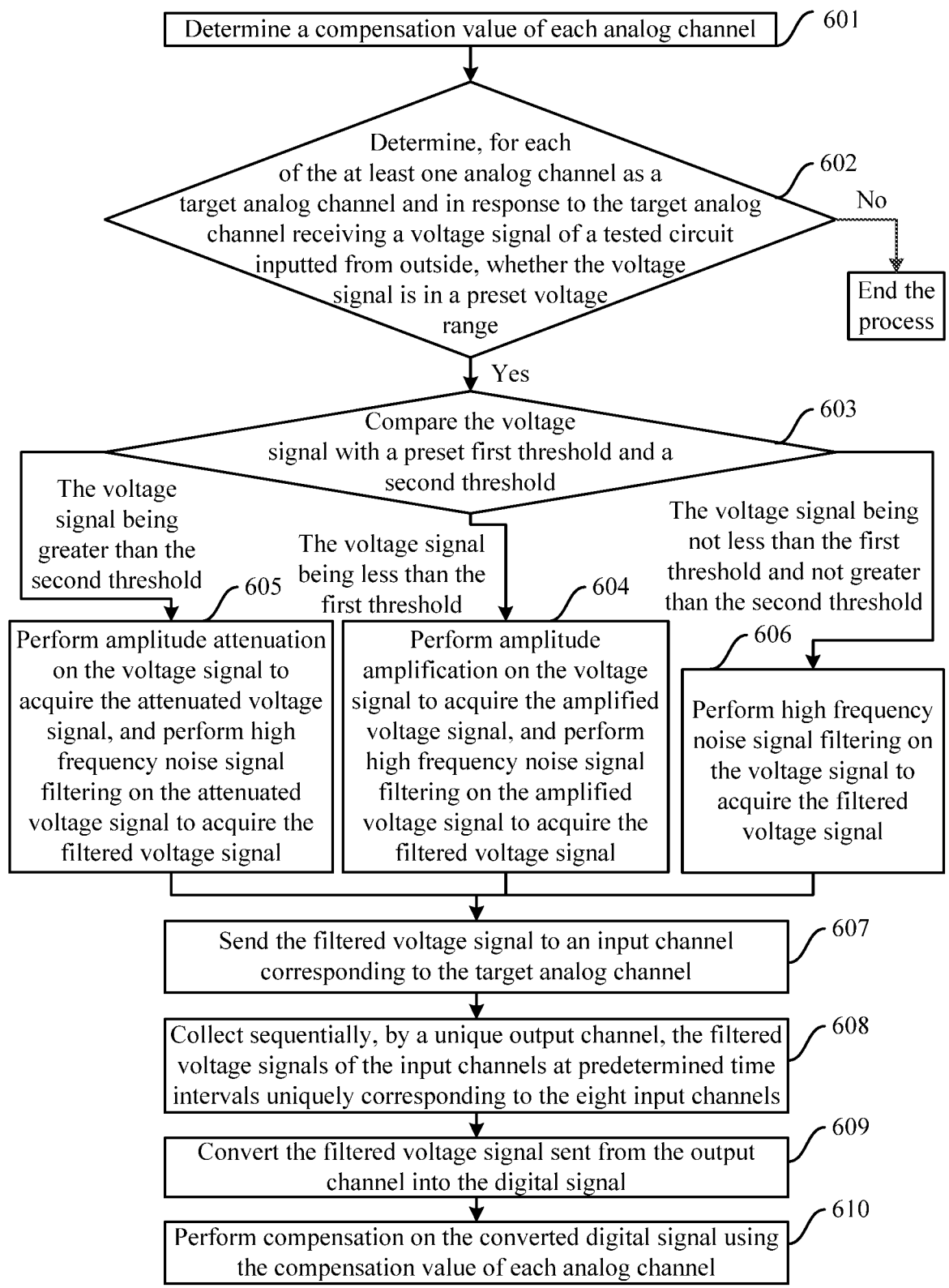
FIG. 6 is a flowchart of another signal processing method according to an embodiment of the present disclosure.

As shown in FIG. 6, another signal processing method is provided according to an embodiment of the present disclosure, which includes the following steps S601 to S610.

In step 601, a compensation value of each analog channel is determined.

A possible implementation of determining the compensation value may include following steps. A correction analog signal and a correction digital signal corresponding to the correction analog signal are predetermined. For each of at least one analog channel as a target analog channel, the correction analog signal is outputted to the target analog channel, a digital signal corresponding to the correction analog signal is acquired, and a difference between the correction digital signal and the acquired digital signal is determined as a compensation value of the target analog channel. Repeating the above steps, the compensation value for each analog channel can be determined.

After processed by the analog channel, the correction analog signal may be converted into the digital signal by an analog-to-digital conversion unit.

In step 602, for each of the at least one analog channel as a target analog channel, in response to the target analog channel receiving a voltage signal of a tested circuit inputted from outside, it is determined whether the voltage signal is in a preset voltage range. In a case that the voltage signal is in a preset voltage range, the process goes to step 603. Otherwise, the process ends.

Based on the preset voltage range, some invalid abnormal analog signals may be first filtered out, so as to improve accuracy of signal processing.

The voltage signal of the tested circuit inputted from outside is generally an analog signal.

In step 603, the voltage signal is compared with a preset first threshold and a second threshold. In response to the voltage signal being less than the first threshold, the process goes to step 604. In response to the voltage signal being greater than the second threshold, the process goes to step 605. In response to the voltage signal being not less than the first threshold and not greater than the second threshold, the process goes to step 606.

In step 604, amplitude amplification is performed on the voltage signal to acquire the amplified voltage signal, and high frequency noise signal filtering is performed on the amplified voltage signal to acquire the filtered voltage signal. Then the process goes to step 607.

In step 605, amplitude attenuation is performed on the voltage signal to acquire the attenuated voltage signal, and high frequency noise signal filtering is performed on the attenuated voltage signal to acquire the filtered voltage signal. Then the process goes to step 607.

In step 606, in response to the voltage signal being not less than the first threshold and not greater than the second threshold, high frequency noise signal filtering is performed on the voltage signal to acquire the filtered voltage signal. Then the process goes to step 607.

In step 607, the filtered voltage signal is sent to an input channel corresponding to the target analog channel.

Eight input channels may be predetermined, and each analog channel corresponds to one of the input channels.

In step 608, the filtered voltage signals of the input channels are sequentially collected by a unique output channel at predetermined time intervals uniquely corresponding to the input channels.

A unique output channel may be utilized to collect signals in multiple input channels.

In step 609, the filtered voltage signal sent from the output channel is converted into a digital signal.

In step 610, compensation is performed on the converted digital signal using the compensation value of each analog channel.

For example, the analog channel X receives the voltage signal 1 of the tested circuit inputted from outside. As described above, after the voltage signal 1 is filtered, the filtered voltage signal 1 is acquired, which is then converted into the digital signal 1. Then, in this step, compensation may be performed on the digital signal 1 using the compensation value of the analog channel X, to acquire the compensated digital signal 1.

In summary, the embodiments of the present disclosure have at least the following beneficial effects.

1. In the embodiment of the present disclosure, the signal processing apparatus includes the at least one analog channel and the analog-to-digital conversion unit. Each of the at least one analog channel is configured to, in response to receiving the first analog signal inputted from outside, condition the first analog signal to generate the second analog signal, and send the second analog signal to the analog-to-digital conversion unit. The analog-to-digital conversion unit is configured to convert the second analog signal sent from any of the analog channel into the digital signal. By conditioning the analog signal inputted from outside, the conditioned analog signal is easy to be processed by the analog-to-digital conversion unit. Therefore, the present disclosure can improve accuracy of processing the analog signal.

2. In the embodiment of the present disclosure, by using the unique output channel and increasing the number of the input channels, the limited collection resources can be reasonably allocated.

3. In the embodiment of the present disclosure, based on the predetermined self-correction solution, the compensation value of each analog channel can be calculated, with which the accuracy of signal conditioning can be further improved.

It should be noted that, the relationship terms such as "first", "second" and the like are only used herein to distinguish one entity or operation from another, rather than to necessitate or imply that an actual relationship or order exists between the entities or operations. Furthermore, the terms such as "include", "comprise" or any other variants thereof means to be non-exclusive. Therefore, a process, a method, an article or a device including a series of elements include not only the disclosed elements but also other elements that are not clearly enumerated, or further include inherent elements of the process, the method, the article or the device. Unless expressively limited, the statement "including a . . . " does not exclude the case that other similar elements may exist in the process, the method, the article or the device other than enumerated elements.

Those skilled in the art can understand that all or part of the steps of the above method embodiments may be implemented by instructing relevant hardware via a program. The foregoing program may be stored in a computer readable storage medium, and the program when executed performs the steps in the foregoing method embodiments. The foregoing storage medium includes various media that can store program codes, such as a ROM, a RAM, a magnetic disk, or an optical disk.

It should be noted that the above description only illustrates preferred embodiments of the present disclosure, and is only intended to explain the technical solutions of the present disclosure, instead of limiting the protection scope of the present disclosure. Any modification, equivalent, improvement, or the like made in the spirit and scope of the present disclosure falls in the protection scope of the present disclosure.

The invention claimed is:

1. An apparatus for analog-to-digital conversion, comprising:
at least one analog channel, and
an analog-to-digital conversion unit, wherein:
each of the at least one analog channel is configured to, in response to receiving a first analog signal inputted from outside, condition the first analog signal to generate a second analog signal, and send the second analog signal to the analog-to-digital conversion unit; and
the analog-to-digital conversion unit is configured to convert the second analog signal sent from any of the at least one analog channel into a digital signal;
and wherein:
the first analog signal is a voltage signal of a tested circuit;
each of the at least one analog channel comprises an interface protector, an attenuator, an amplifier, and a filter;
the interface protector is configured to:
determine, in response to receiving the voltage signal of the tested circuit inputted from outside, whether the voltage signal is in a preset voltage range,
compare, in response to the voltage signal being in the preset voltage range, the voltage signal with a preset first threshold and a preset second threshold,
send, in response to the voltage signal being less than the first threshold, the voltage signal to the amplifier,
send, in response to the voltage signal being greater than the second threshold, the voltage signal to the attenuator, and
send, in response to the voltage signal being not less than the first threshold and not greater than the second threshold, the voltage signal to the filter;
the amplifier is configured to perform amplitude amplification on the voltage signal sent by the interface protector, and send the amplified voltage signal to the filter;
the attenuator is configured to perform amplitude attenuation on the voltage signal sent by the interface protector, and send the attenuated voltage signal to the filter; and
the filter is configured to perform high frequency noise signal filtering on the received voltage signal, and send the filtered voltage signal to the analog-to-digital conversion unit.

2. The apparatus according to claim 1, wherein:
the analog-to-digital conversion unit comprises a multiplexer and an analog-to-digital converter, and the multiplexer comprises eight input channels, an output channel, and three address codes;
based on setting information of an external field programmable gate array (FPGA), the three address codes correspond to eight control signals, and the eight control signals correspond to the eight input channels in a one-to-one manner;
each of the analog channels corresponds to one of the input channels;
each of the analog channels is configured to send the generated second analog signal to the input channel corresponding to the analog channel;
the output channel is configured to sequentially collect the second analog signals of the eight input channels at predetermined time intervals uniquely corresponding to the eight input channels, and sequentially send the second analog signals to the analog-to-digital converter; and
the analog-to-digital converter is configured to convert the second analog signal sent by the output channel into the digital signal.

3. The apparatus according to claim 2, further comprising a physical address configuration unit, wherein:
the physical address configuration unit comprises an 8-bit dual in-line package (DIP) switch, each bit of the DIP switch has a break pin that is connected to a pull-up resistor applied with a fixed voltage, and has a close pin that is grounded; and
the physical address configuration unit is configured to control a switch state of each bit of the DIP switch based on the setting information of the external FPGA, and configure a medium access control (MAC) address of the signal processing apparatus based on the switch state of each bit of the DIP switch.

4. The apparatus according to claim 1, further comprising a self-correcting unit, wherein:
the self-correcting unit is configured to predetermine a correction analog signal and a correction digital signal corresponding to the correction analog signal; and for each of the at least one analog channel as a target analog channel, the self-correcting unit is configured to output the correction analog signal to the target analog channel, acquire a current digital signal corresponding to the correction analog signal and outputted by the analog-to-digital conversion unit, and determine a difference between the correction digital signal and the current digital signal as a compensation value for the target analog channel; and
the analog-to-digital conversion unit is further configured to perform, after converting the second analog signal sent by the target analog channel into the digital signal, compensation on the digital signal based on the compensation value of the target analog channel.

5. The apparatus according to claim 4, further comprising a physical address configuration unit, wherein:
the physical address configuration unit comprises an 8-bit dual in-line package (DIP) switch, each bit of the DIP switch has a break pin that is connected to a pull-up resistor applied with a fixed voltage, and has a close pin that is grounded; and
the physical address configuration unit is configured to control a switch state of each bit of the DIP switch based on the setting information of the external FPGA, and configure a medium access control (MAC) address of the signal processing apparatus based on the switch state of each bit of the DIP switch.

6. The apparatus according to claim 1, further comprising a physical address configuration unit, wherein:
the physical address configuration unit comprises an 8-bit dual in-line package (DIP) switch, each bit of the DIP switch has a break pin that is connected to a pull-up resistor applied with a fixed voltage, and has a close pin that is grounded; and
the physical address configuration unit is configured to control a switch state of each bit of the DIP switch based on the setting information of the external FPGA, and configure a medium access control (MAC) address of the signal processing apparatus based on the switch state of each bit of the DIP switch.

7. A system for analog-to-digital conversion, comprising:
at least one signal processing apparatus, and
a processor, wherein:
each of the at least one signal processing apparatus is the apparatus for analog-to-digital conversion according to claim 1;
each of the signal processing apparatus has a medium access control (MAC) address different from others; and
the processor is connected to each of the signal processing apparatus via a controller area network (CAN) bus.

8. The apparatus according to claim 1, further comprising a physical address configuration unit, wherein:
the physical address configuration unit comprises an 8-bit dual in-line package (DIP) switch, each bit of the DIP switch has a break pin that is connected to a pull-up resistor applied with a fixed voltage, and has a close pin that is grounded; and
the physical address configuration unit is configured to control a switch state of each bit of the DIP switch based on the setting information of the external FPGA, and configure a medium access control (MAC) address of the signal processing apparatus based on the switch state of each bit of the DIP switch.

9. The system according to claim 7, wherein:
the analog-to-digital conversion unit comprises a multiplexer and an analog-to-digital converter, and the multiplexer comprises eight input channels, an output channel, and three address codes;
based on setting information of an external field programmable gate array (FPGA), the three address codes correspond to eight control signals, and the eight control signals correspond to the eight input channels in a one-to-one manner;
each of the analog channels corresponds to one of the input channels;
each of the analog channels is configured to send the generated second analog signal to the input channel corresponding to the analog channel;
the output channel is configured to sequentially collect the second analog signals of the eight input channels at predetermined time intervals uniquely corresponding to the eight input channels, and sequentially send the second analog signals to the analog-to-digital converter; and
the analog-to-digital converter is configured to convert the second analog signal sent by the output channel into the digital signal.

10. The system according to claim 7, wherein the signal processing apparatus further comprises a self-correcting unit, wherein:
the self-correcting unit is configured to predetermine a correction analog signal and a correction digital signal corresponding to the correction analog signal; and for each of the at least one analog channel as a target analog channel, the self-correcting unit is configured to output the correction analog signal to the target analog channel, acquire a current digital signal corresponding to the correction analog signal and outputted by the analog-to-digital conversion unit, and determine a difference between the correction digital signal and the current digital signal as a compensation value for the target analog channel; and
the analog-to-digital conversion unit is further configured to perform, after converting the second analog signal sent by the target analog channel into the digital signal, compensation on the digital signal based on the compensation value of the target analog channel.

11. The system according to claim 7, wherein the signal processing apparatus further comprises a physical address configuration unit, wherein:
the physical address configuration unit comprises an 8-bit dual in-line package (DIP) switch, each bit of the DIP switch has a break pin that is connected to a pull-up resistor applied with a fixed voltage, and has a close pin that is grounded; and
the physical address configuration unit is configured to control a switch state of each bit of the DIP switch based on the setting information of the external FPGA, and configure the medium access control (MAC) address of the signal processing apparatus based on the switch state of each bit of the DIP switch.

12. A method for analog-to-digital conversion, comprising:
conditioning, for each of at least one analog channel as a target analog channel and in response to the target analog channel receiving a first analog signal inputted from outside, the first analog signal to generate a second analog signal; and
converting the second analog signal into a digital signal;
wherein:
the first analog signal is a voltage signal of a tested circuit, and the conditioning of the first analog signal to generate the second analog signal comprises:
determining whether the voltage signal is in a preset voltage range;
comparing, in response to the voltage signal being in a preset voltage range, the voltage signal with a preset first threshold and a second threshold;
performing, in response to the voltage signal being less than the first threshold, amplitude amplification on the voltage signal to acquire the amplified voltage signal, and performing high frequency noise signal filtering on the amplified voltage signal to acquire the filtered voltage signal;
performing, in response to the voltage signal being greater than the second threshold, amplitude attenuation on the voltage signal to acquire the attenuated voltage signal, and performing high frequency noise signal filtering on the attenuated voltage signal to acquire the filtered voltage signal; and
performing, in response to the voltage signal being not less than the first threshold and not greater than the second threshold, high frequency noise signal filtering on the voltage signal to acquire the filtered voltage signal.

13. The method according to claim 12, wherein:
each of the at least one analog channel corresponds to one of predetermined eight input channels, and the converting the second analog signal into the digital signal comprises:

sending the second analog signal to an input channel corresponding to the target analog channel;

collecting sequentially, by a unique output channel, the second analog signals of the eight input channels at predetermined time intervals uniquely corresponding to the eight input channels; and converting the second analog signal sent from the output channel into the digital signal.

14. The method according to claim 12, wherein:

before converting the second analog signal into the digital signal, the method further comprises:

predetermining a correction analog signal and a correction digital signal corresponding to the correction analog signal; and for each of the target analog channel, outputting the correction analog signal to the target analog channel, acquiring a current digital signal corresponding to the correction analog signal, and determining a difference between the correction digital signal and the current digital signal as a compensation value of the target analog channel; and after converting the second analog signal into the digital signal, the method further comprises:

performing compensation on the digital signal using the compensation value of the target analog channel.

15. A method for analog-to-digital conversion, comprising:

conditioning, for each of at least one analog channel as a target analog channel and in response to the target analog channel receiving a first analog signal inputted from outside, the first analog signal to generate a second analog signal; and converting the second analog signal into a digital signal;

wherein:

each of the at least one analog channel corresponds to one of predetermined eight input channels, and the converting the second analog signal into the digital signal comprises:

sending the second analog signal to an input channel corresponding to the target analog channel;

collecting sequentially, by a unique output channel, the second analog signals of the eight input channels at predetermined time intervals uniquely corresponding to the eight input channels; and converting the second analog signal sent from the output channel into the digital signal.

\* \* \* \* \*